(12) United States Patent
Seufferlein

(10) Patent No.: US 8,313,813 B2
(45) Date of Patent: Nov. 20, 2012

(54) PROCESS FOR TREATING A SURFACE

(75) Inventor: Rainer Seufferlein, Munich (DE)

(73) Assignee: Decoma (Germany) GmbH, Sulzbach (DE)

( * ) Notice: Subject to any disclaimer, the term of this patent is extended or adjusted under 35 U.S.C. 154(b) by 1056 days.

(21) Appl. No.: 12/290,440

(22) Filed: Oct. 30, 2008

(65) Prior Publication Data

US 2009/0061110 A1     Mar. 5, 2009

Related U.S. Application Data

(62) Division of application No. 11/451,970, filed on Jun. 12, 2006, now abandoned.

(30) Foreign Application Priority Data

Jun. 10, 2005 (DE) .......................... 10 2005 028 121

(51) Int. Cl.
*B05D 1/02* (2006.01)
*C23C 16/40* (2006.01)
*C23C 16/513* (2006.01)
*H05H 1/24* (2006.01)

(52) U.S. Cl. .................. 427/579; 427/248.1; 427/255.6; 427/427; 427/427.3

(58) Field of Classification Search ............... 427/248.1, 427/255.6, 427, 427.3, 579
See application file for complete search history.

(56) References Cited

U.S. PATENT DOCUMENTS

| 5,445,987 A | 8/1995 | Kuroda |
| 5,462,899 A | 10/1995 | Ikeda |
| 5,593,741 A | 1/1997 | Ikeda |
| 2004/0004003 A1 | 1/2004 | Hesse |

FOREIGN PATENT DOCUMENTS

| DE | 693 04 819 T2 | 1/1997 |
| DE | 19813709 | 9/1999 |
| DE | 10131156 | 1/2003 |
| DE | 697 21 836 T2 | 2/2004 |
| DE | 10 2004 029 911 | 1/2005 |
| EP | 0776989 | 6/1997 |
| JP | 09306906 A | 11/1997 |

OTHER PUBLICATIONS

English Abstract of DE 10131156 Dated Jan. 16, 2003.
English Abstract of DE 19813709 Dated Sep. 30, 1999.
English Abstract of DE 102004029911 Dated Jan. 13, 2005.
English Abstract of EP 0776989 Dated Jun. 4, 1997.
English Abstract of JP 09306906 Dated Nov. 28, 1997.
English Abstract of Corresponding Application EP 0577447 for DE 693 04 819 T2 Dated Jan. 30, 1997.

*Primary Examiner* — Leo B Tentoni
(74) *Attorney, Agent, or Firm* — Miller Canfield

(57) ABSTRACT

A process for treating a surface of an aluminium component and an aluminium component of this kind are described. The process described is characterized in that a silicon oxide layer is applied to the surface of the aluminium component.

7 Claims, 1 Drawing Sheet

PROCESS FOR TREATING A SURFACE

Cross-Reference to Related Applications

This application is a divisional application of U.S. patent application Ser. No. 11/451,970, filed on Jun. 12, 2006 now abandoned, which claims priority to DE 10 2005 028 121.4 filed on Jun. 10, 2005.

BACKGROUND OF THE INVENTION

1. Field of the Invention

The invention relates to a process for treating a surface of an aluminium component and an aluminium component treated in this manner.

2. Description of the Related Art

Components made of aluminium and aluminium alloys are used, for example, on the exteriors of motor vehicles. These aluminium components are also used as decorative trims. Their use as exterior parts requires that these components have high corrosion resistance. For this reason, it is known to increase the resistance of the surface of these components by anodic oxidation, thereby producing an eloxal coating.

It is also important to note with motor vehicles that car washes, for example, are operated using cleaners with a pH of 13.5 or above. They cause corrosion to aluminium trims as the eloxal coating is only resistant up to a pH of not more than 12.5.

Published German Patent DE 101 31 156 A1 discloses an article with a plasma-polymeric coating and a method of producing it. The article referred to comprises a substrate and a plasma-polymeric coating comprising oxygen, carbon, and silicon attached to the substrate over its surface. In the process described, a plasma-polymeric coating is applied, the plasma being formed from oxygen and hexamethyldisiloxane (HMDSO). The ratio of oxygen to HMDSO is varied so that the gas flux of oxygen is in the ratio of 27.5:100.

A disadvantage of the process described is that it is very complex and expensive. In addition, during low pressure plasma polymerization, shields or edges that are unfavorable in energy terms cause weaknesses in the coating, which may lead to corrosion at a later stage.

SUMMARY OF THE INVENTION

The invention relates to a process for protecting an aluminium component provides that a silicon oxide (SiOx) layer be applied to the surface of the aluminium component. Preferably, before the silicon oxide layer is applied, an eloxal coating is produced by a typically anodic oxidation, the surface of this coating then constituting the surface of the aluminium component. A tetraethyl orthosilicate (TEOS) may be used as the silicon oxide which is to be applied.

In one embodiment, the silicon oxide is applied by an open-air plasma process. This process may also be carried out as a low pressure process.

It is expedient to use air as the carrier gas. This air, as an ionized carrier gas, can be directed through a nozzle onto the component which is to be treated, the ionized carrier gas picking up the vaporized precursor, namely, the silicon oxide. The component can be treated from every side using an adjustable nozzle. With this nozzle, it is also possible to target specific parts of the component.

In one embodiment, the nozzle is moved along the surface which is to be treated at a spacing of 4 mm therefrom. The nozzle is preferably passed over the surface to be treated at a rate of 10 m/min. It is, of course, also possible to move the component relative to the nozzle. It has proved advantageous to supply the carrier gas at a rate of 2,000 l/h, in which case the surface of the component is subjected to an air flow of about 300 l/h.

In a preferred embodiment, the carrier gas is heated to a temperature of 200° to 210° C. The nozzle used may also be a so-called PPW10 nozzle. It is preferable to use 100 percent TEOS as the precursor. The used TEOS precursor costs roughly only a quarter as much as the known precursor HMDSO, thus making the process considerably more economical. In addition, the precursor is only applied where the coating is actually needed, thereby also reducing consumption.

The process according to the invention is particularly suitable for small-scale production, as it does not require expensive electrodes for a vacuum chamber. Moreover, the process can be used universally for components of different geometries. In addition, it results in improved quality by applying more uniform coatings.

The aluminium component according to the invention has at least one silicon oxide layer on its surface. Preferably, the surface of the aluminium component is formed by a surface of an eloxal coating produced by typically anodic oxidation. The silicon oxide layer used is preferably a layer of tetraethyl orthosilicate. The number of coats depends on the subsequent use. However, it has proved advantageous to apply four layers of silicon oxide to the surface of the, aluminium component.

The aluminium component according to the invention is particularly suitable as a decorative trim for a motor vehicle.

Further features and embodiments of the invention will become apparent from the description and accompanying drawings. It will be understood that the features recited hereinbefore and those to be detailed below may be used not only in the particular combination specified but also in other combinations on their own, without departing from the scope of the present invention.

BRIEF DESCRIPTION OF THE DRAWINGS

The invention is schematically illustrated by embodiments shown ia the drawings and is described in detail hereinafter with reference to the drawings, wherein.

DETAILED DESCRIPTION OF THE PREFERRED EMBODIMENTS

Figure 1:
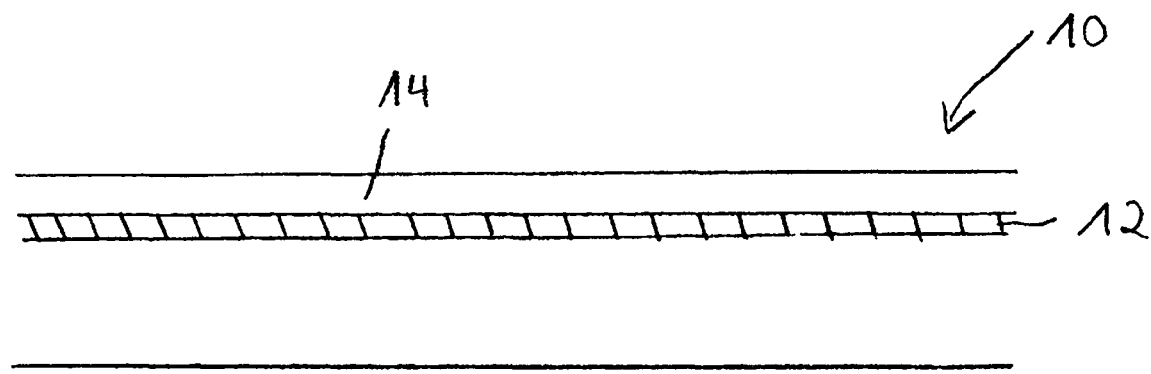
FIG. 1 is a sectional view of one embodiment of the component according to the invention.

FIG. 1 shows an aluminium component, according to the invention, generally designated 10, which may be used, for example, as a decorative trim on a motor vehicle. The sectional view shows different layers. As the aluminium component 10 is pretreated by anodic oxidation, it has an eloxal coating 12 in a surface region. This eloxal coating 12 is resistant up to a pH of 12.5.

A silicon oxide layer 14, in this case a TEOS layer, is applied to the eloxal coating 12 of the aluminium component 10. Obviously, more layers, preferably four layers, may also be applied. Thus, during production of the aluminium component 10, the component is first subjected to anodic oxidation so as to form the eloxal coating 12 shown. This eloxal coating 12 provides a degree of protection from external influences and gives the aluminium component 10 a particular optical appearance. In order to provide the aluminium component 10 with better protection from external influences, the silicon oxide layer 14 is applied as a so-called functional layer.

Figure 2:
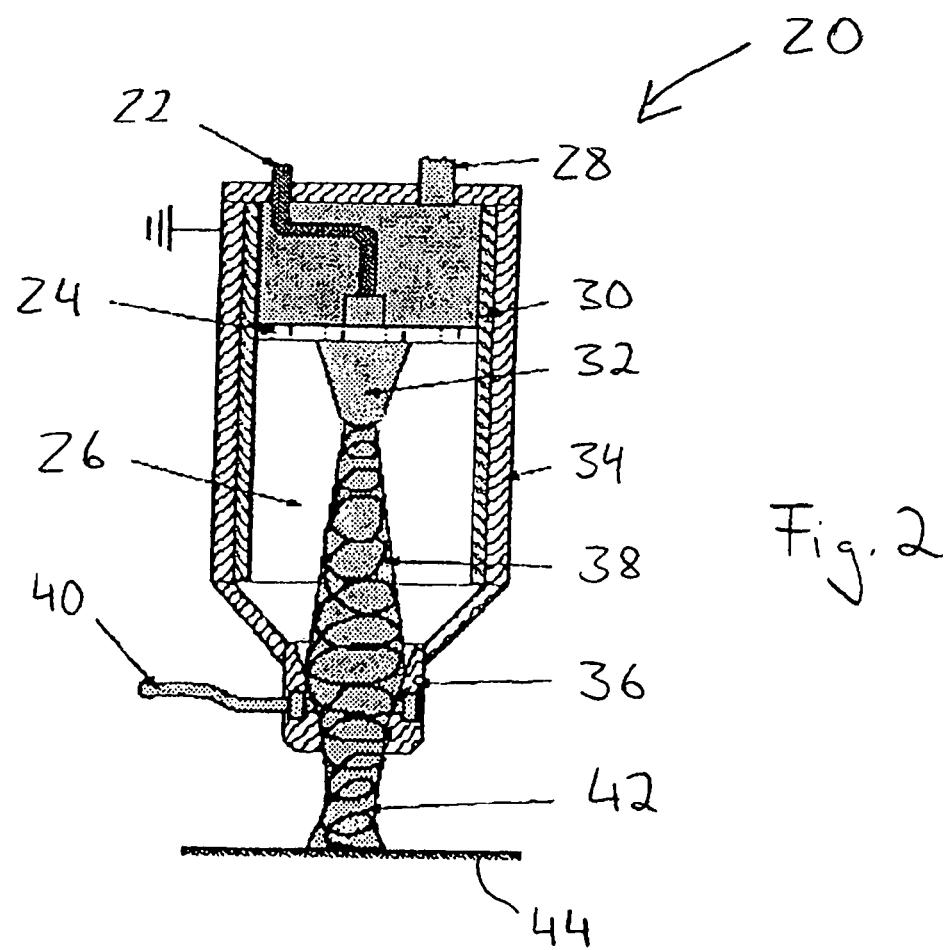
FIG. 2 is an arrangement for carrying out the processing according to the invention.

FIG. 2 shows an arrangement 20 which is used to carry out the process according to the invention. The arrangement 20 shown comprises a voltage supply 22, a masking shield 24 with boreholes, a discharge area 26, a gas supply 28 using compressed air, an insulating layer 30, an electrode 32, a stainless steel housing 34 and a nozzle head or nozzle 36. During the process, ionized carrier gas, typically air, is supplied through the gas supply 28, heated and fed to the nozzle head 36 in a plasma current discharge path 38, while the so-called precursor is also fed in at a supply point 40, picked up in the vaporized state by the carrier gas and sprayed through the nozzle head 36 as a plasma current 42 with precursor onto a surface 44 which is to be treated.

The following process parameters have proved suitable:

| | |
|---|---|
| Precursor: | TEOS: tetraethyl orthosilicate: Si04C8H20 |
| Generator: | FG 2002S; 421 V/4, 7 A/18 kHz |
| Nozzle: | PPW10 |
| Speed: | 10 m/min |
| Distance: | 4 mm |
| Carrier gas: | air 2,000 l/h |
| Layer data: | carrier gas: 300 l/h |
| | precursor: 100% TEOS |
| | temperature: 200° to 210° C. |
| Number of Layers: | 4 |

With the process parameters specified, it is possible to achieve a suitable processing window.

The arrangement 20 shown can be moved relative to the surface 44 during treatment so that surface regions of a component can be targeted. The simple construction of the arrangement 20, compared with known vacuum chambers, makes it possible to apply uniform layers to components of differing geometry.

Thus, using the process according to the invention, it is possible to treat different components at relatively low cost while still achieving outstanding results.

What is claimed is:

1. A process for treating a surface (44) of an aluminium component (10), wherein at least one silicon oxide layer (14) is applied to the surface of the aluminium component (10) using a carrier gas, the process including the steps:
   supplying the carrier gas at a rate of 2,000 l/h;
   heating the carrier gas to a temperature of about 200° to 210° C.;
   applying the silicon oxide layer (14) using a nozzle (36), wherein the nozzle (36) is moved along the surface (44) to be treated at a spacing of 4 mm therefrom; and
   moving the nozzle (36) along the surface (44) to be treated at a rate of 10 m/min.

2. The process according to claim 1, wherein an eloxal coating (12) is produced by oxidation, the surface (44) of which forms the surface (44) of the aluminium component (10).

3. The process according to claim 1, wherein a tetraethyl orthosilicate (TEOS) is applied to the surface (44).

4. The process according to claim 1, wherein the silicon oxide layer (14) is applied by means of an open-air plasma process.

5. The process according to claim 4, wherein a low pressure open-air plasma process is carried out.

6. The process according to claim 5, wherein air is used as the carrier gas.

7. A process for treating a surface (44) of an aluminium component (10), wherein at least one silicon oxide layer (14) is applied to the surface of the aluminium component (10), the process including the steps:
   applying the silicon oxide layer (14) using a nozzle (36), wherein the nozzle (36) is moved along the surface (44) to be treated at a spacing of 4 mm therefrom; and
   moving the nozzle (36) along the surface (44) to be treated at a rate of 10 m/min.

* * * * *